(12) United States Patent
Kwon et al.

(10) Patent No.: US 6,607,938 B2
(45) Date of Patent: Aug. 19, 2003

(54) WAFER LEVEL STACK CHIP PACKAGE AND METHOD FOR MANUFACTURING SAME

(75) Inventors: Yong Hwan Kwon, Kyungki-do (KR); Sa Yoon Kang, Seoul (KR); Dong Hyeon Jang, Seoul (KR); Min Kyo Cho, Seoul (KR); Gu Sung Kim, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/200,077

(22) Filed: Jul. 18, 2002

(65) Prior Publication Data

US 2003/0017647 A1 Jan. 23, 2003

(30) Foreign Application Priority Data

Jul. 19, 2001 (KR) ........................................ 2001-43445

(51) Int. Cl.⁷ .............................................. H01L 21/44
(52) U.S. Cl. ...................... 438/109; 438/108; 438/113; 438/118; 257/686; 257/777; 257/778
(58) Field of Search ................................. 438/109, 108, 438/107, 110, 113, 118, 119; 257/686, 685, 700, 723, 724, 777, 778

(56) References Cited

U.S. PATENT DOCUMENTS

| | | | | |
|---|---|---|---|---|
| 5,563,084 A | * | 10/1996 | Ramm et al. ............... 438/109 |
| 5,657,537 A | * | 8/1997 | Saia et al. .................... 257/724 |
| 5,891,761 A | * | 4/1999 | Vindasius et al. ........... 438/109 |
| 5,985,693 A | * | 11/1999 | Leedy .......................... 438/107 |
| 6,242,286 B1 | * | 6/2001 | Cellarosi .................... 257/700 |
| 6,271,060 B1 | * | 8/2001 | Zandman et al. ........... 438/113 |
| 6,355,501 B1 | * | 3/2002 | Fung et al. .................. 438/109 |
| 6,500,694 B1 | * | 12/2002 | Enquist ........................ 257/777 |

* cited by examiner

Primary Examiner—Kevin M. Picardat
(74) Attorney, Agent, or Firm—Harness, Dickey & Pierce, P.L.C.

(57) ABSTRACT

A wafer level chip package has a redistrubution substrate, at least one lower semiconductor chip stacked on the redisctribution substrate, and an uppermost semiconductor chip. The redistribution substrate has a redistribution layer and substrate pads connected to the redistribution layer. The lower semiconductor chip is stacked on the redistribution layer and may have through holes for partially exposing the redistribution layer, the through holes corresponding to the substrate pads, and having conductive filling material filling the through holes. The uppermost semiconductor chip may have the same elements as the lower semiconductor chip, and may be flip chip bonded to the through holes. The package may further have a filling layer for filling areas between chips, a metal lid for coating most of the external surfaces, and external connection terminals formed on and electrically connected to the exposed redistribution layer from the first dielectric layer of the redistribution substrate.

16 Claims, 16 Drawing Sheets

WAFER LEVEL STACK CHIP PACKAGE AND METHOD FOR MANUFACTURING SAME

BACKGROUND

1. Field of the Invention

The present invention relates to the field of semiconductor manufacturing and, more particularly to a wafer level stack chip package using a redistribution substrate and redistribution semiconductor chips and a method for manufacturing such a stack chip package.

2. Description of Related Art

Recent trends in electronics have been developed toward miniaturization, i.e., smaller and thinner chips. In order to satisfy these pressing demands, a chip scale package manufactured at wafer level using a redistribution technique has been introduced.

This package is referred to as a wafer level chip scale package (WLCSP). As described above, the WLCSP employs a redistribution technique, which reroutes electrode pads on the chip to bigger pads in different positions. External connection terminals such as solder balls may be formed on the rerouted pads. In WLCSP, a series of package manufacturing processes are carried out under wafer level.

As is well known, the conventional semiconductor wafer comprises many integrated circuit chips on a silicon substrate. FIG. 1 schematically shows a conventional semiconductor wafer 10. FIG. 2 is an enlarged plan view of a portion "A" of FIG. 1. As shown in FIGS. 1 and 2, the wafer 10 comprises a plurality of integrated circuit chips 20 and scribing areas 14 for separating an integrated circuit chip 20 from other integrated circuit chips 20. Chip pads 22 serving as I/O terminals are formed on each chip 20. A passivation layer 24 such as a nitride layer may be coated on the whole surface of the chip 20 except for the chip pads 22.

FIG. 3 is a plan view of conventional redistribution wafer level chip scale packages 30. As shown in FIG. 3, external connection terminals 36 are disposed on different positions from the chip pads 22 of FIG. 2. The chip pads 22 are rerouted into different positions by the redistribution process, and the external connection terminals 36 are attached to the rerouted pads. After finishing the manufacturing of the packages at the wafer level, the wafer 10 is cut into a plurality of unit packages 30 along the scribing areas 14.

FIG. 4 is a sectional view of the redistribution wafer level chip scale package 30 of FIG. 3. As shown in FIG. 4, the chip pads 22 and the passivation layer 24 are formed on the upper surface of a semiconductor substrate 12. A first polymeric layer 31 is formed on the passivation layer 24, and serves as a stress buffer and an electrically dielectric layer. An under barrier metal (UBM) layer 32 is deposited on the chip pads 22 and the first polymeric layer 31. A redistribution layer 33 is formed on the UBM layer 31, and a second polymeric layer 34 is formed on the redistribution layer 33. The second polymeric layer 34 serves to protect the redistribution layer 33 from the external environment. Herein, the second polymeric layer 34 is partially removed, thereby exposing the redistribution layer 33. An UBM layer 35 is deposited on the exposed redistribution layer 33, and the external connection terminal 36 is mounted thereon.

The above-described conventional wafer level chip scale package comprises a thin polymeric layer, thereby reducing electrical performance. Further, due to the increase of the number of the chip pads and the decrease of the pitch between the chip pads, fan-in and fan-out are not easily achieved.

The conventional wafer level chip scale package comprising the external connection terminals on its one surface, i.e. the first surface, can be stacked on other wafer level chip scale package, but the electrical connection between the stacked chip scale packages is not easy. That is, the first surface of the upper chip scale package is to be stacked on the other surface, i.e., the second surface of the lower chip scale package. At this time it is difficult to electrically interconnect the external connection terminals of the upper chip scale package to the external connection terminals of the lower chip scale package.

The stack chip scale package manufactured by stacking the wafers reduces wafer yield and stack package yield. Just one failed chip among the chips of the stack package causes the stack chip scale package to be detected as a failure, thereby reducing the yield of the stack chip package.

SUMMARY OF THE INVENTION

Accordingly, a goal is to provide a stack chip package manufactured by three-dimensionally stacking wafer level chip packages and a manufacturing method for same.

Another goal is to improve the yield of the wafer level stack chip package.

Still another goal is to prevent the deterioration of the electrical properties due to the conventional thin polymeric layer.

Yet another goal is to provide the wafer level stack chip package, which properly achieves fan-in and/or fan-out.

In order to achieve these foregoing and other objects, the present invention is directed to a wafer level stack chip package formed by three-dimensionally stacking a plurality of semiconductor chips. The wafer level chip package comprises a redistrubution substrate, at least one lower semiconductor chip stacked on the redisctribution substrate, and an uppermost semiconductor chip. The redistribution substrate may comprise a first dielectric layer in a predetermined pattern, a redistribution layer formed on the first dielectric layer, a second dielectric layer formed on the first dielectric layer and the redistribution layer, and substrate pads connected to the redistribution layer. The lower semiconductor chip is stacked on the redistribution layer and may comprise a semiconductor substrate, a passivation layer formed on the upper surface of the substrate, a plurality of chip pads exposed from the passivation layer, a redistribution layer formed on the passivation layer and electrically connected to the chip pads, a polymeric layer formed on the passivation and layer and the redistribution layer, and having through holes for partially exposing the redistribution layer, the through holes corresponding to the substrate pads, and having conductive filling material filling the through holes, and inner connection terminals formed on and electrically connected to the exposed redistribution layer via the through holes. The uppermost semiconductor chip may comprise the same elements as the lower semiconductor chip, and may be flip chip bonded to the through holes. The package may further comprise a filling layer for filling areas between chips, a metal lid for coating most of the external surfaces, and external connection terminals formed on and electrically connected to the exposed redistribution layer from the first dielectric layer of the redistribution substrate.

Further, the present invention provides a method for manufacturing the above-described wafer level stack chip package.

BRIEF DESCRIPTION OF THE DRAWINGS

These and other features and advantages of the present invention will be readily understood with reference to the following detailed description thereof provided in conjunction with the accompanying drawings, wherein like reference numerals designate like structural elements, and, in which:

FIGS. 5 to 9 illustrate for manufacturing a redistribution substrate;

FIGS. 10 to 12 illustrate a step for manufacturing a redistribution semiconductor chip; and FIGS. 13 to 27 illustrate a step for manufacturing a stack chip package by three-dimensionally stacking the redistribution semiconductor chips on the redistribution substrate.

DETAILED DESCRIPTION OF THE PREFERRED EMBODIMENTS

Preferred embodiments of the present invention will be described below with reference to the accompanying drawings.

Figure 10:
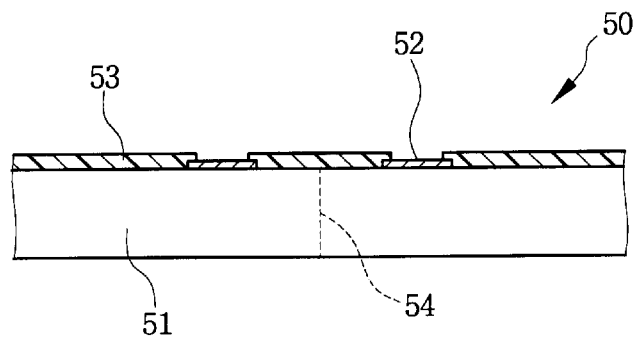
Figure 11:
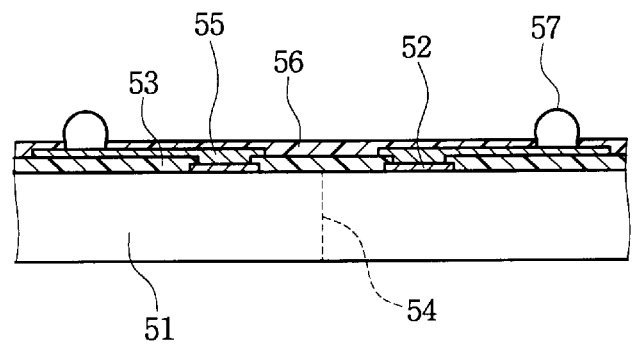
Figure 12:
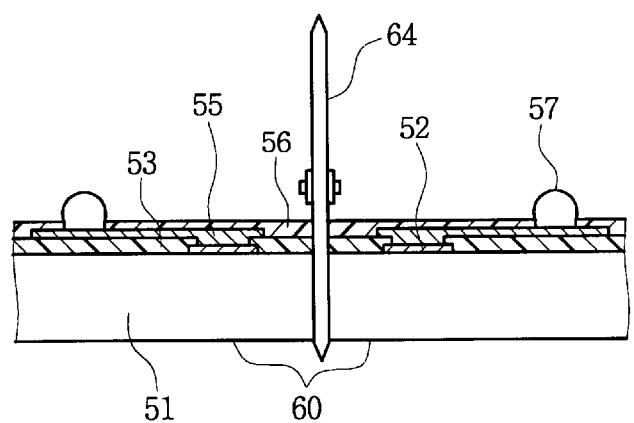

FIGS. 5 to 27 illustrate a manufacturing method of a wafer level stack chip package in accordance with a first embodiment of the present invention. FIGS. 5 to 9 illustrate a step for manufacturing a redistribution substrate. FIGS. 10 to 12 illustrate a step for manufacturing a redistribution semiconductor chip. FIGS. 13 to 27 illustrate a step for manufacturing a stack chip package by three-dimensionally stacking the redistribution semiconductor chips on the redistribution substrate. Referring to FIGS. 5 to 27, a manufacturing method of a wafer level stack chip package of the first embodiment of the present invention will be described below.

Referring to FIGS. 5 to 27, the manufacturing method of the wafer level stack chip package in accordance with the first embodiments comprises three main steps, i.e., a step of manufacturing a redistribution substrate, a step of manufacturing a redistribution semiconductor chip, and a step of three-dimensionally stacking a plurality of the redistribution semiconductor chips on the redistribution substrate.

Figure 1:
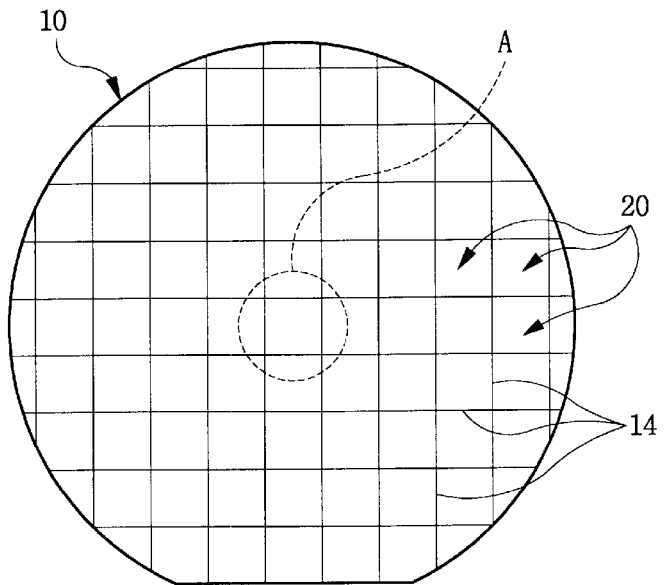
FIG. 1 is a plan view of the conventional semiconductor wafer.
Figure 2:
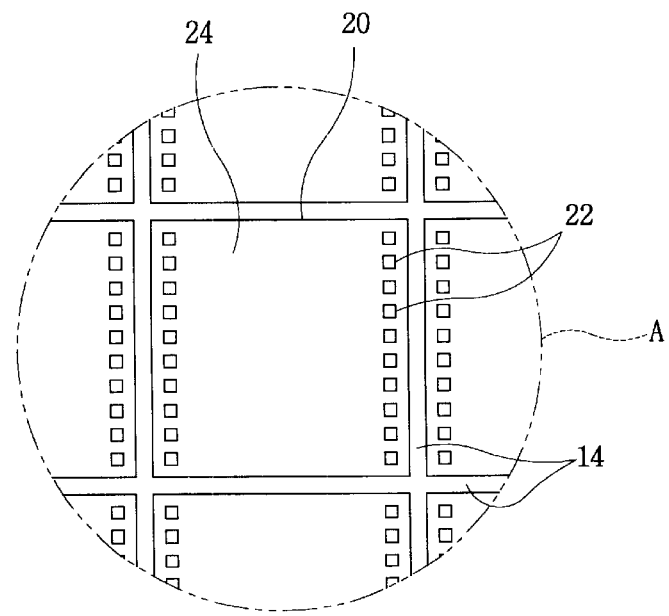
FIG. 2 is an enlarged plan view of a portion "A" of FIG. 1.
Figure 3:
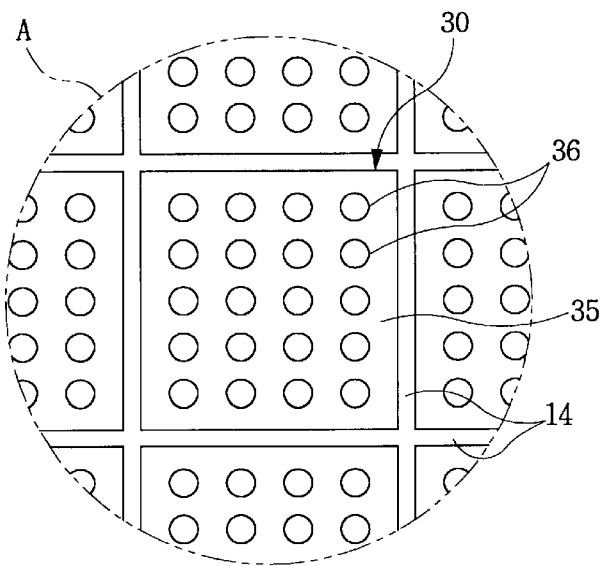
FIG. 3 is a plan view of a conventional redistribution wafer level chip scale package.
Figure 4:
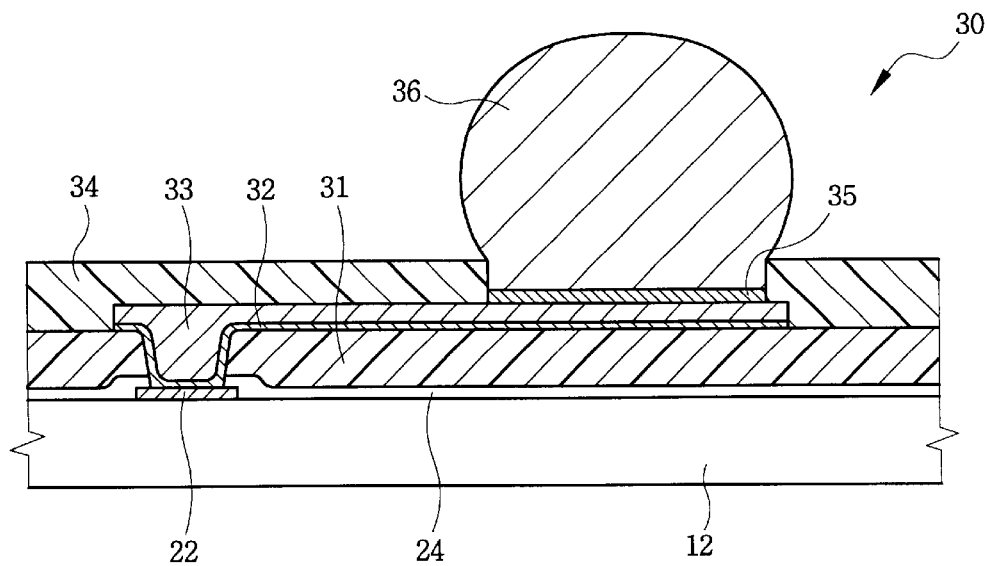
FIG. 4 is a sectional view of the conventional redistribution wafer level chip scale package of FIG. 3.
Figure 5:
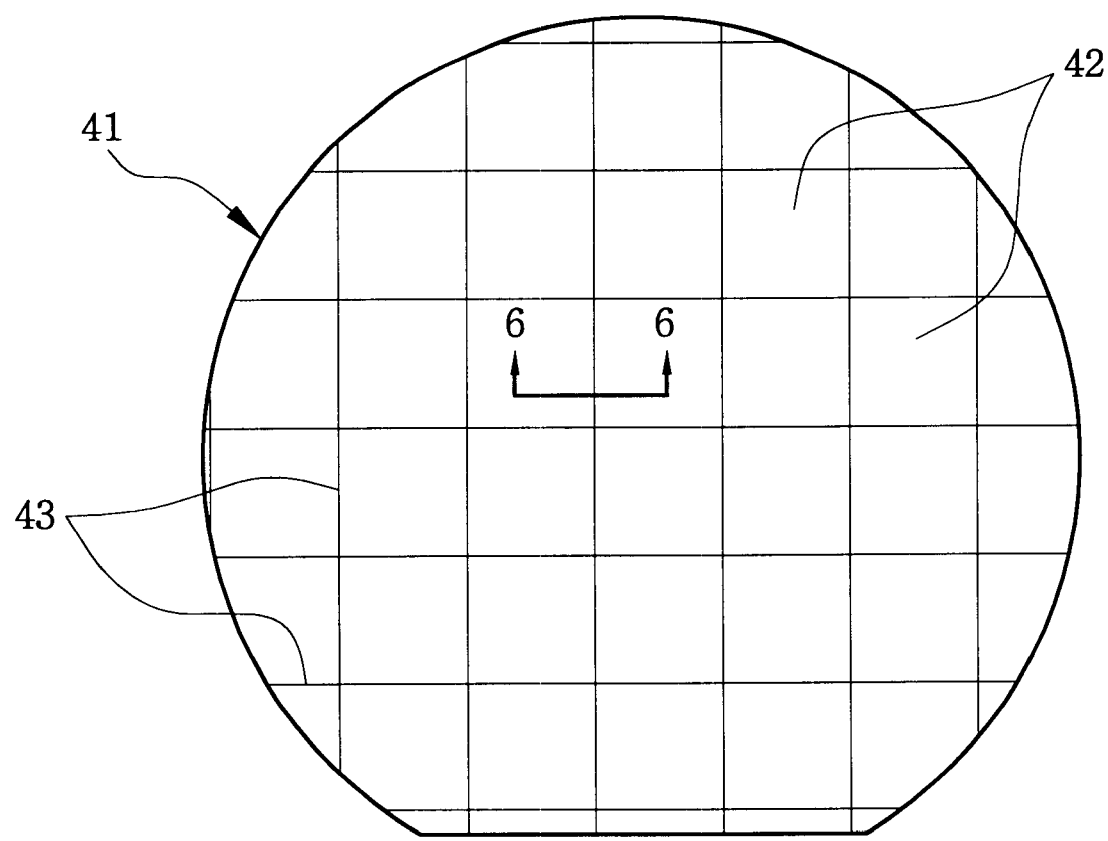
FIGS. 5 to 27 illustrate a manufacturing method of a wafer level stack chip package in accordance with a first embodiment of the present invention.

As shown in FIG. 5, a semiconductor substrate 41 is prepared. Herein, the semiconductor substrate 41 is a silicon wafer substrate provided prior to the FAB process. The semiconductor substrate 41 comprises chip mounting areas 42 and scribing areas 43 for separating a chip mounting area 42 from other chip mounting areas 42. Semiconductor chips are to be three-dimensionally stacked on the chip mounting area 42 of the semiconductor substrate 41. In order to use the conventional semiconductor chip manufacturing apparatus, the semiconductor substrate 41 may have the same diameter as that of the conventional semiconductor wafer, i.e., 6 inches or 8 inches, and preferably has a thickness of about 675 μm to 725 μm.

The dimension of the chip mounting areas 42 is determined by fan-in and/or fan-out. The scribing areas 43 may be marked on the semiconductor substrate 41 by photo process.

Figure 6:
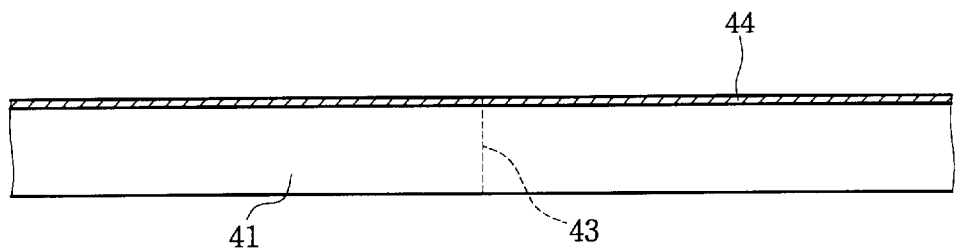

As shown in FIG. 6, an under barrier metal (UBM) layer 44 is formed on the upper surface of the semiconductor substrate 41. The UBM layer 44 serves to improve adhesion, to prevent diffusion and to provide a plating base. The UBM layer 44 is formed by an electro-plating, an electroless plating, a sputtering, or an evaporation. The UBM layer 44 is made of copper (Cu), nickel (Ni) and their combination, or may be made of other metals. For example, the UBM layer 44 of the present invention can be made of titanium (Ti) or chromium (Cr) with a thickness of about 300 to 3,000 Å, and copper (Cu) or nickel (Ni) with a thickness of about 2,000 to 15,000 Å.

Figure 7:
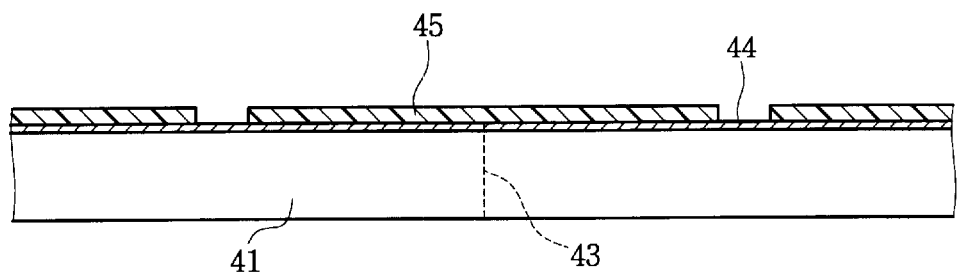

As shown in FIG. 7, a first dielectric layer 45 is formed on the UBM layer 44. The first dielectric layer 45 is partially removed thereby exposing the UBM layer 44. Herein, the removed portions of the first dielectric layer 45 are areas for attaching the external connection terminals. The first dielectric layer 45 serves as a thermal stress buffer and an electrically dielectric layer. The first dielectric layer 45 may be made of polyimide, polybenzoxazole (PBO), benzocyclobutene (BCB), epoxy, or other materials. The selected material may be coated on the UBM layer 44 by the conventional spin coating method and partially removed by the photolithography process, thereby forming the first dielectric layer 45. The first dielectric layer 45 may have a thickness of about 2 μm to 50 μm, and is hardened at a temperature of about 300° C. for 2 hours.

Figure 8:
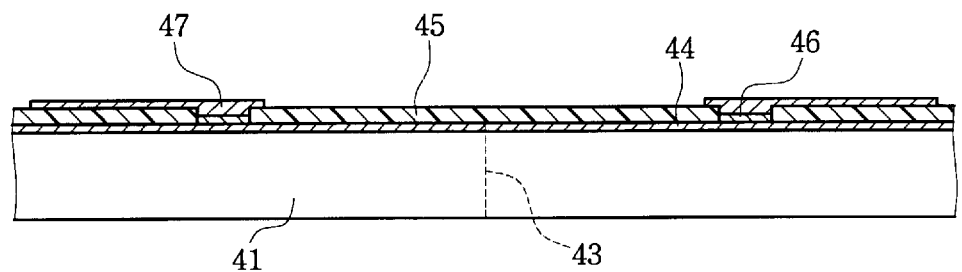

As shown in FIG. 8, a redistribution layer 47 is formed. The redistribution layer 47 supplies wirings for rerouting chip pads of a semiconductor chip to be stacked into different positions. First, an Au immersion layer 46 is formed on the removed portions of the first dielectric layer 45 by Au-immersion process. Then, the redistribution layer 47 in a predetermined pattern is formed on the first dielectric layer 45 and the Au immersion layer 46. Before forming the redistribution layer 47, an UBM layer made of Ti/Cr or Cu/Ni with a thickness of several thousands Å is formed on the first dielectric layer 45 and the Au immersion layer 46. Then, a photoresist (not shown) is coated thereon and patterned. The redistribution layer 47 is formed by plating Cu/Ni using the photoresist pattern as a mask. Herein, the UBM layer serves as a plating electrode. The redistribution layer 47 may have a thickness of approximately 5 μm.

Figure 9:
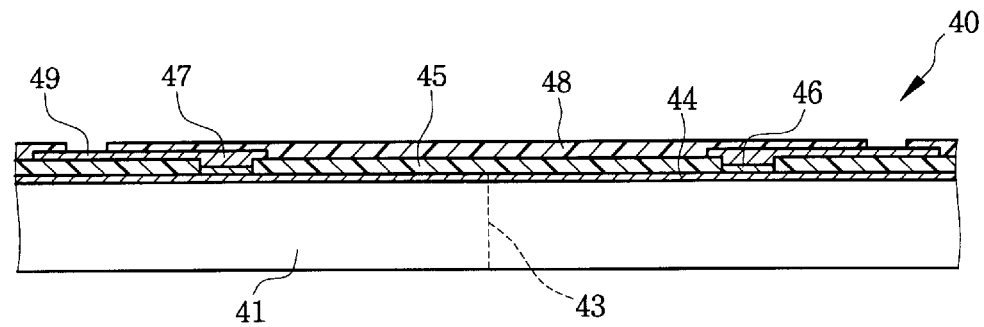

As shown in FIG. 9, a second dielectric layer 48 is formed. The second dielectric layer 48 serves to protect the redistribution layer 47 from the external environment and is the same as the first dielectric layer 45 in material and forming method. That is, the polyimide or other material is coated and partially removed by the photolithography process, thereby forming substrate pads 49. The second dielectric layer 48 has a thickness of about 2 μm to 50 μm, and is hardened at a temperature of 300¤ for 2 hours.

The above-described redistribution substrate 40 serves as a substrate for stacking wafer level semiconductor chips thereon and provides a means for rerouting the chip pads of the stacked chip.

A process for manufacturing a redistribution semiconductor chip starts with preparing a semiconductor wafer 50. As shown in FIG. 10, the semiconductor wafer 50 comprises a semiconductor substrate 51, a plurality of chip pads 52 and a passivation layer 53. The chip pads 52 are made of a metal such as aluminum (Al), and the passivation layer 53 is a nitride layer and covers the whole upper surface of the wafer 50 except for the chip pads 52.

As shown in FIG. 11, a redistribution layer 55 is formed on the passivation layer 53 and electrically connected to the chip pads 52.

An UBM layer (not shown) is formed on the chip pads 52 and the passivation layer 53. The UBM layer is made of titanium (Ti) or chromium (Cr) with a thickness of 300 to 3,000 Å, and copper (Cu) or nickel (Ni) with a thickness of 2,000 to 15,000 Å thereon. The redistribution layer 55 is formed on the UBM layer. The redistribution layer 55 is a wiring pattern for rerouting the chip pads 52 and electrically connected to the chip pads 52. A photoresist (not shown) is coated and patterned, and the redistribution layer 55 is formed by plating copper (Cu) or nickel (Ni) using the photoresist pattern as a mask. Herein, the UBM layer is used as a plating electrode. The redistribution layer 55 has a thickness of about 5 μm.

After completing the plating, the photoresist pattern is removed and the UBM layer beyond the perimeter of the redistribution layer 55 is etched. Thereby, the UBM layer remains only under the perimeter of the redistribution layer 55.

A polymeric layer 56 is formed on the redistribution layer 55. The polymeric layer 56 serves to protect the redistribution layer 55 from the external environment, and is the same as the first and second dielectric layer 45, 48 of the redistribution substrate 40 in material and forming method. That is, the polyimide or other materials is coated and partially removed by the photolithography process, thereby partially exposing the redistribution layer 55. The polymeric layer 56 has a thickness of about 2 μm to 50 μm, and is hardened at a temperature of about 300° for 2 hours.

Inner connection terminals 57 such as solder balls are attached to the exposed redistribution layer 55 from the polymeric layer 56, thereby manufacturing the semiconductor chips in wafer level. The inner connection terminals 57 serve as a means for electrically connecting the semiconductor chip to the redistribution substrate and a means for electrically connecting a plurality of the semiconductor chips to be three-dimensionally stacked to each other.

Although a solder ball is preferably used as the inner connection terminal 57, a metal bump made of copper (Cu), gold (Au), or nickel (Ni) may be used. The metal bump is formed by a plating method. The solder ball may be formed by various methods such as a plating, a ball-placement, or a stencil printing method and subsequently a reflowing process. Herein, a diameter of the solder ball is approximately 400 μm.

As shown in FIG. 12, the wafer 50 is cut into a plurality of semiconductor chips 60 along the scribing area 54 with a scribing means 64. The obtained semiconductor chip 60 is referred to as a "wafer level chip scale package (WLCSP)."

Then, a step for manufacturing a stack chip package using the redistribution substrate and the wafer level semiconductor chips is described below. Herein, only chips that are tested and detected as good products are used.

Since a plurality of the semiconductor chips are three-dimensionally stacked on the redistribution substrate, the semiconductor chips are orderly referred to as a first, a second, and a third semiconductor chip. That is, the lowermost chip is the first semiconductor chip.

Except for the uppermost semiconductor chip, other semiconductor chips to be stacked have the same configuration. Therefore, other semiconductor chips are referred to as lower semiconductor chips.

Figure 13:
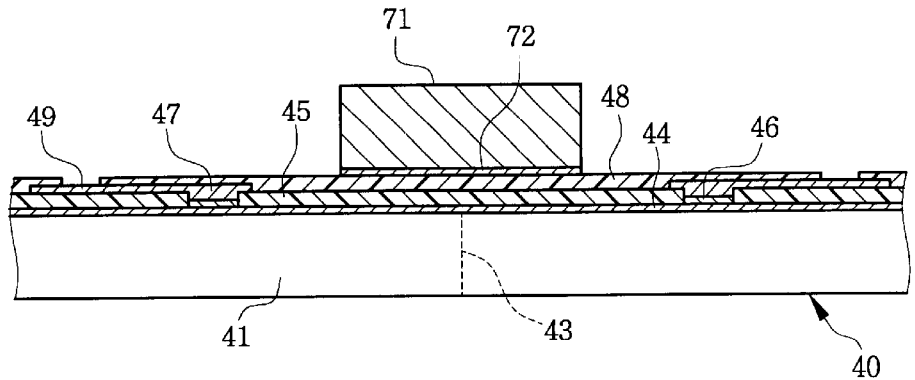

As shown in FIG. 13, a first metal wall 71 is formed on the redistribution substrate 40. First, an UBM layer 72 is formed on the redistribution substrate 40, then the first metal wall 71 with a predetermined thickness is formed on the UBM layer 72 over the scribing area 43 of the redistribution substrate 40. The UBM layer 72 is made of titanium (Ti) or chromium (Cr) with a thickness of 300 to 3,000 Å, and copper (Cu) or nickel (Ni) with a thickness of 2,000 to 15,000 Å. The first metal wall 71 is made of copper (Cu) or nickel (Ni) with a thickness of 20 to 150 μm by the electroplating method. Then, portions of the UBM layer 72, which is formed outside the perimeter of the first metal wall 71, are removed.

The first metal wall 71 serves as a barrier for polishing in a subsequent back-grinding process and a lid for emitting the heat generated from the stacked semiconductor chips and protecting the stacked semiconductor chips.

Figure 14:
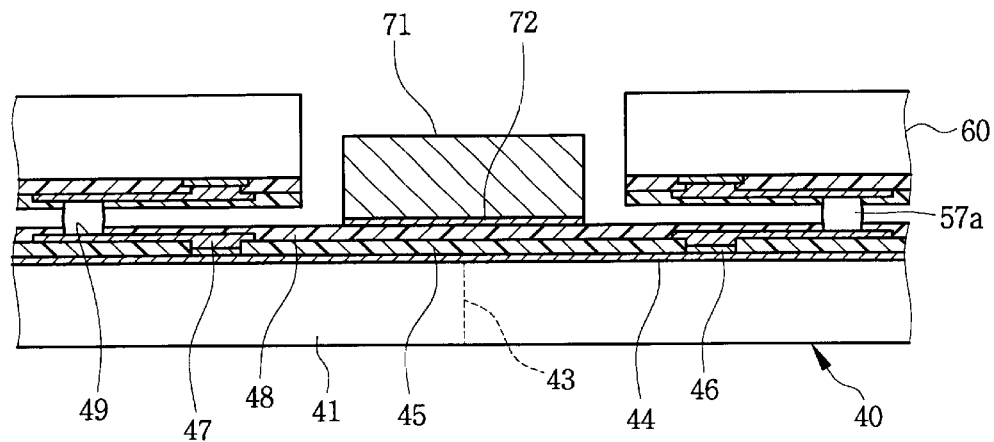

As shown in FIG. 14, the first semiconductor chip 61 is mounted on the redistribution substrate 40. First inner connection terminals 57a of the first semiconductor chip 61 are flip-chip bonded to the substrate pads 49 of the redistribution substrate 40, thereby mounting the first semiconductor chip 60a on the redistribution substrate 40.

Figure 15:
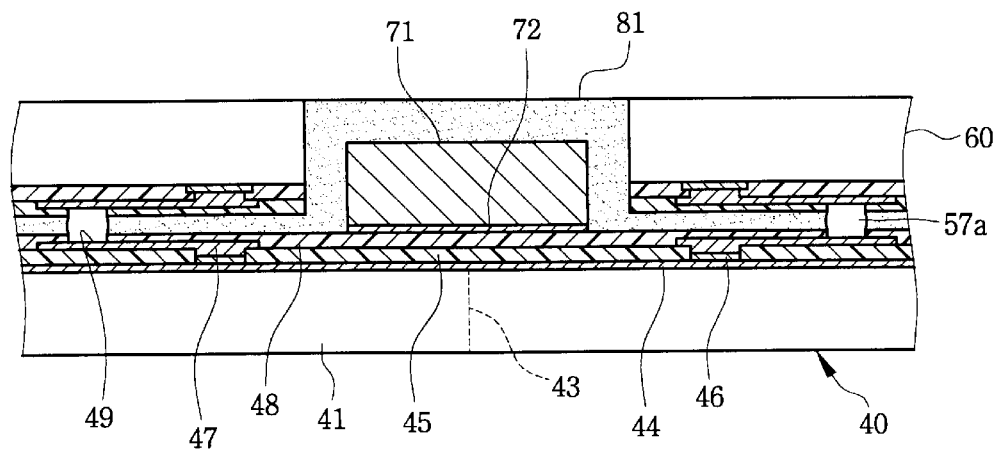

As shown in FIG. 15, an underfilling step is carried out. The flip chip bonding area between the redistribution substrate 40 and the first semiconductor chip 61 are filled with a liquid molding resin by an underfilling method, thereby forming a first filling layer 81. The first filling layer 81 protects the flip chip bonding area from the external environment. Since the metal wall 71 is lower than the first semiconductor chip 61, the first metal wall 71 is filled with the first filling layer 81.

Figure 16:
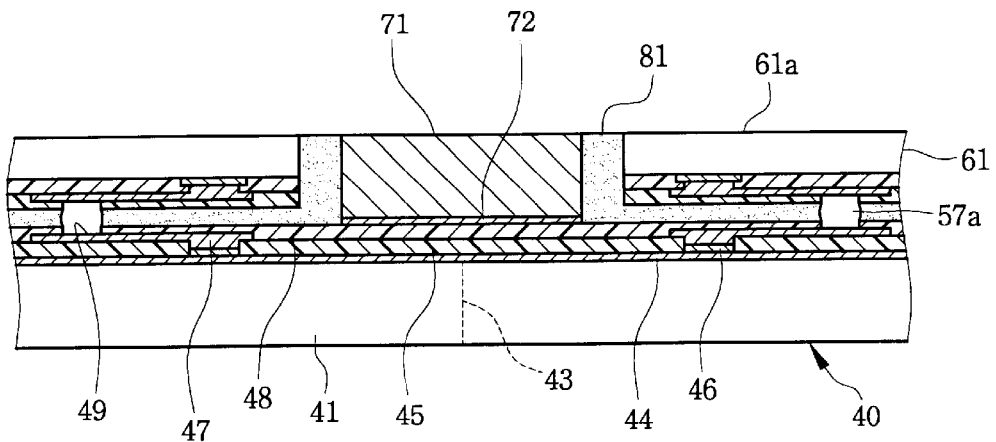

Then, as shown in FIG. 16, the back surface 61a of the first semiconductor chip 61 is ground, thereby minimizing a thickness of the package. Herein, the back surface 61a of the first semiconductor chip 61 and the first filling layer 80 are ground so that the back surface of the first semiconductor chip 60a is coplanar to the upper surface of the first metal wall 71. The back-grinding step employs a spin etching, a dry etching or a chemical mechanical polishing (CMP) method.

The back-grinding of the first semiconductor chip 61 makes reduces the thickness of the package and easily form through holes on the first semiconductor chip 61.

Figure 17:
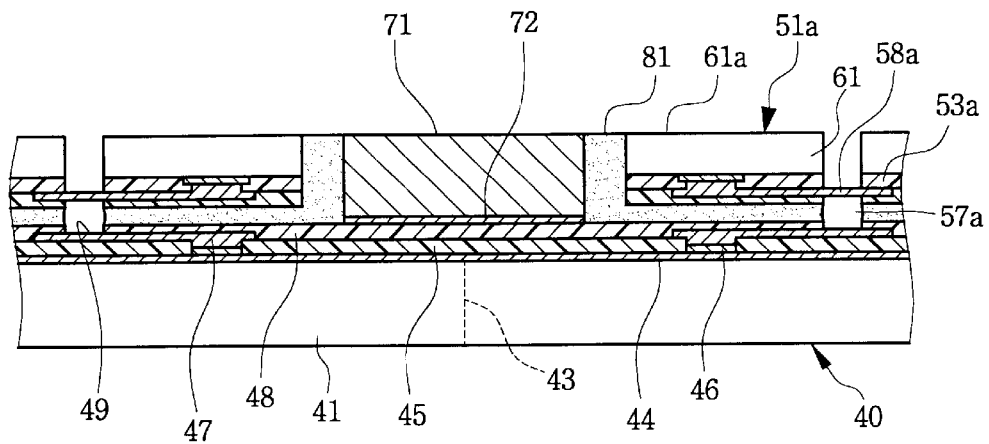

As shown in FIG. 17, through holes 58a are formed through the first semiconductor chip 61. The through holes 58a correspond to the first inner connection terminals 57a and are formed by partially removing the first semiconductor substrate 51a and the passivation layer 53a with a dry or wet etching method. An inner diameter of the through hole 58a is about 10 μm to 100 μm.

Figure 18:
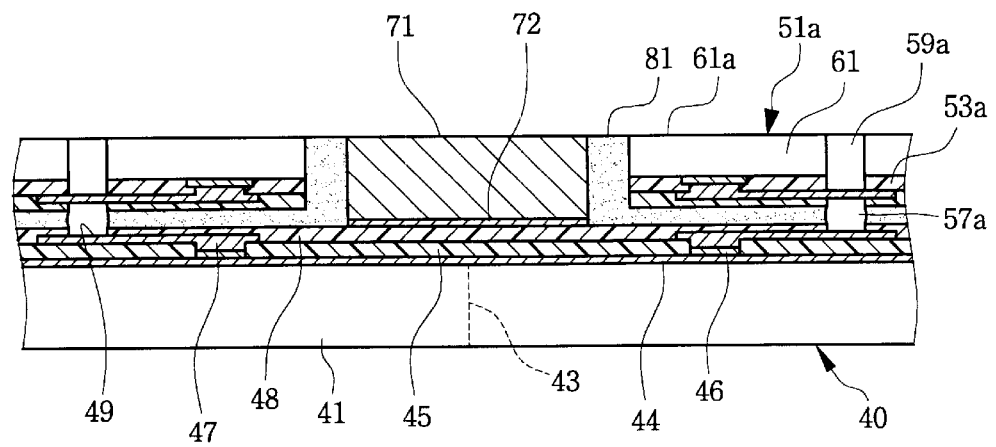

As shown in FIG. 18, the through holes 58a in the first semiconductor chip 61 become filled holes 59a when filled with a first conductive filling material by an electro-plating method using copper (Cu) or nickel (Ni).

Figure 19:
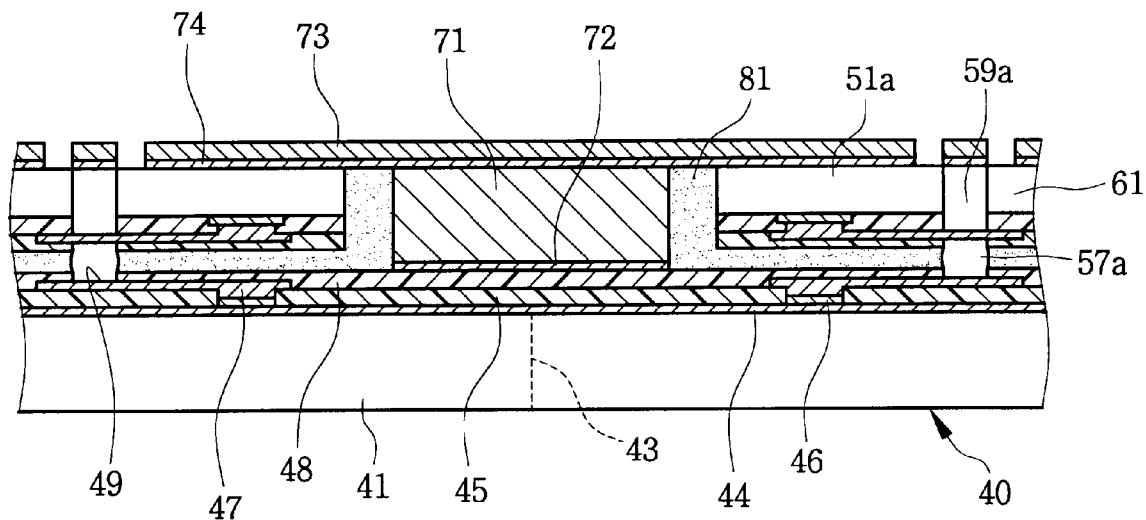

As shown in FIG. 19, a first emissive metal layer 73a is formed on the back surface 61a of first semiconductor chip 61. First, a UBM layer 74 on the first semiconductor chip 61, the first filling layer 81 and the first metal wall 71, then, the first emissive metal layer 73 with a predetermined thickness is formed on the UBM layer 74. The UBM layer is made of titanium (Ti) or chromium (Cr) with a thickness of 300 to 3,000 Å, and copper (Cu) or nickel (Ni) with a thickness of 2,000 to 15,000 Å. The first emissive metal layer 73 is made of copper (Cu) or nickel (Ni) with a thickness of about 3 to 50 μm by an electroplating method. Herein, other areas except for the through holes 55a filled with the first conductive filling material, i.e., the back surface 61a of the first semiconductor chip 61, the first filling layer 81, and the first metal wall 71, are electrically insulated from each other. Therefore, only portions of the first emissive metal layer 73, which are outside the perimeter of the first conductive filling material, are removed.

Figure 20:
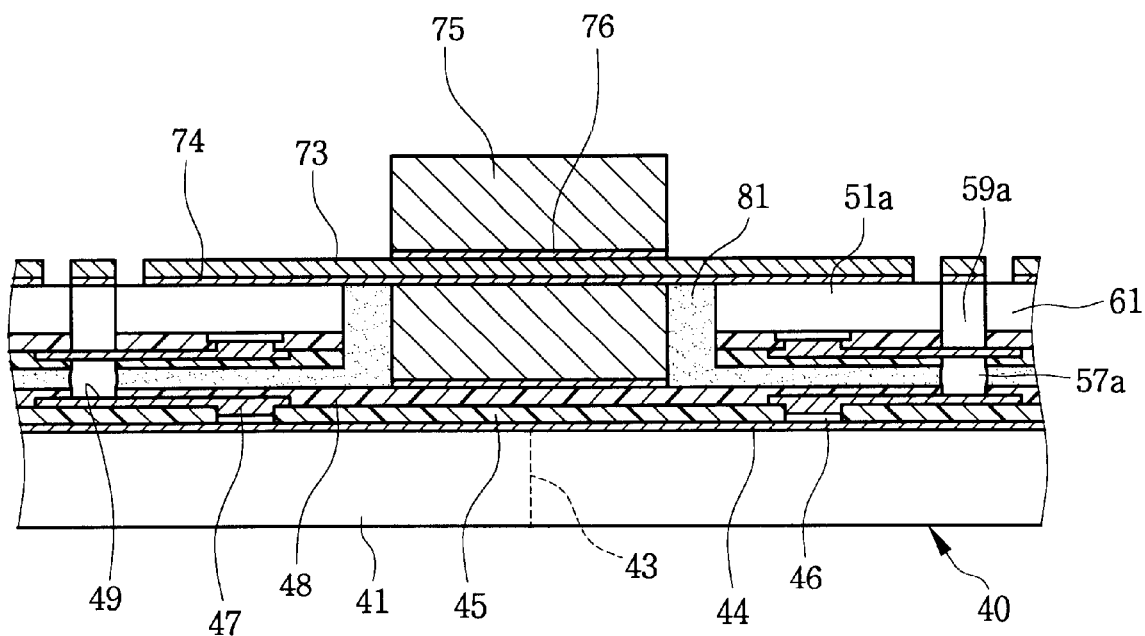

As shown in FIG. 20, a second metal wall 75 is formed on the first emissive metal layer 73, in the same manner as the first metal wall 71. The second metal wall 75 corresponds to the first metal wall 71. Reference numeral 76 represents a UBM layer for forming the second metal wall 75.

Figure 21:
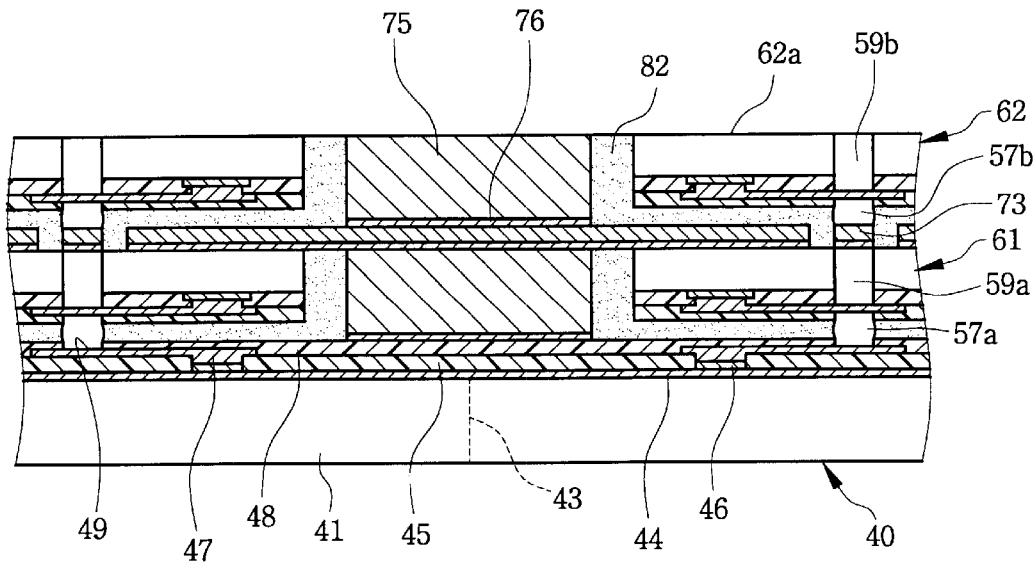

As shown in FIG. 21, the second semiconductor chip 62 is mounted. The second semiconductor chip 62 is mounted in the same manner as the first semiconductor chip 61. Second inner connection terminals 57b of the second semiconductor chip 62 are flip-chip bonded to the first emissive metal layer 73 over the first filled holes 59a. Then, the second filling layer 82 is formed, and the back surface 62a of the second semiconductor chip 62 and the second filling layer 82 are ground.

Figure 22:
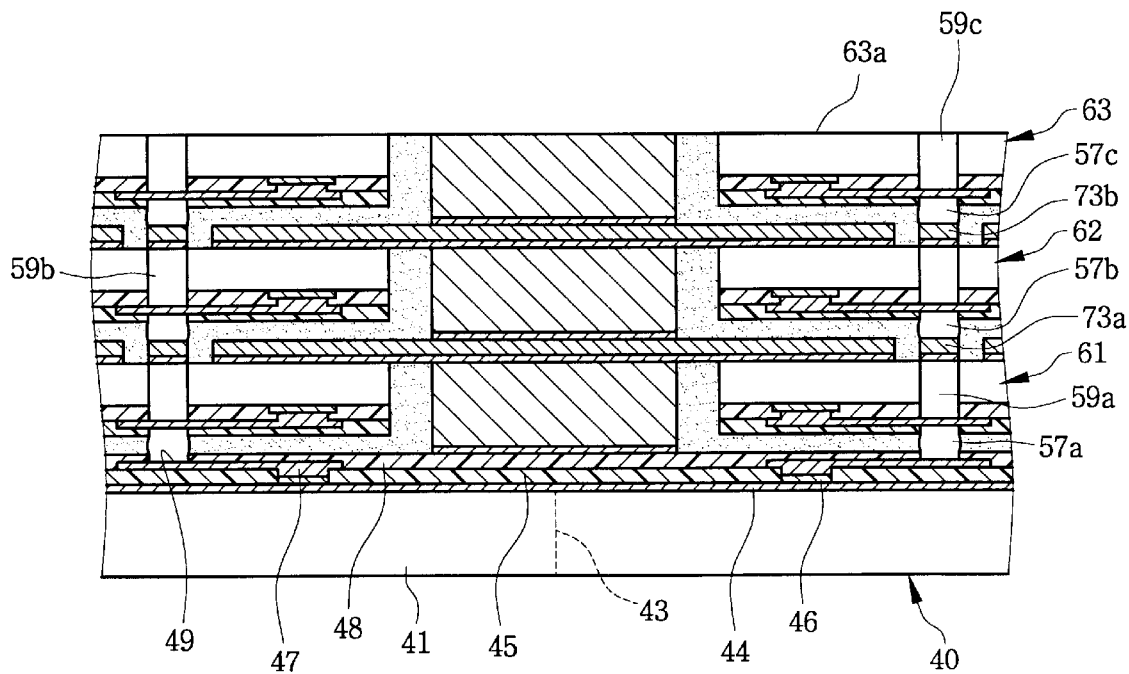

As shown in FIG. 22, the third semiconductor chip 63 is mounted. The third semiconductor chip 63 is mounted in the same manner as the first and second semiconductor chips 61, 62. Third inner connection terminals 57c of the third semiconductor chip 63 are flip-chip bonded to the second emissive metal layer 73b over the second filled holes 59b. Then, the third filling layer 83 is formed, and the back surface 63a of the third semiconductor chip 63 and the third filling layer 83 are ground.

Figure 23:
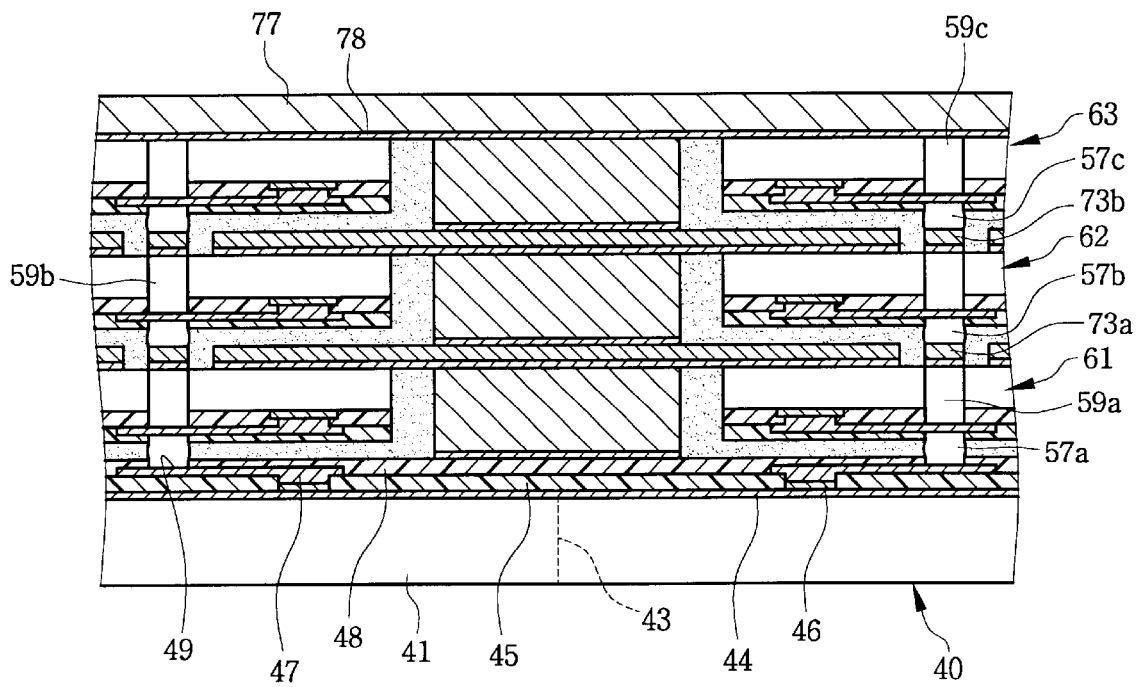

Then, as shown in FIG. 23, a lid metal layer 77 is formed on the third semiconductor chip 63. First, a UBM layer 78 is formed on the third semiconductor chip 63, then, the lid metal layer 77 with a predetermined thickness is formed on the UBM layer 78. The UBM layer 78 is made of titanium (Ti) or chromium (Cr) with a thickness of 300 to 3,000 Å, and copper (Cu) or nickel (Ni) with a thickness of 2,000 to 15,000 Å. The lid metal layer 77 is made of copper (Cu) or nickel (Ni) with a thickness of about 20 μm to 150 μm by an electro-plating method.

In order to separate the above-described stack chip package on the redistribution substrate into individual stack packages, two cutting steps and a wet-etching step are orderly carried out, as described below.

Figure 24:
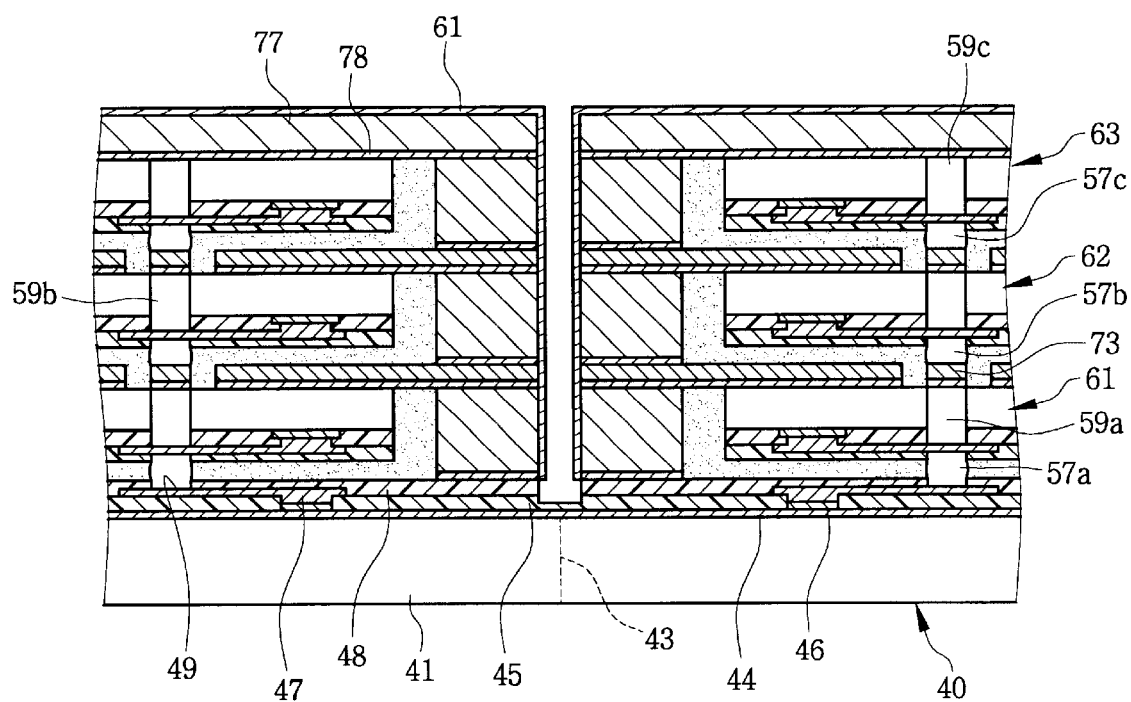

As shown in FIG. 24, the wafer level stack chip package on the redistribution substrate 40 is cut along the scribing area 43 from the lid metal layer 77 to the first dielectric layer 45 and the second dielectric layer 48 under the first metal wall 71. This is a first cutting step. Then, an Au-immersion layer 61 is formed on the upper surface of the lid metal layer 77 and the cutting surfaces by an Au-immersion process, thereby preventing the cutting surfaces and the upper surface of the lid metal layer 77 from damage by an etching solution in a subsequent wet-etching step.

Figure 25:
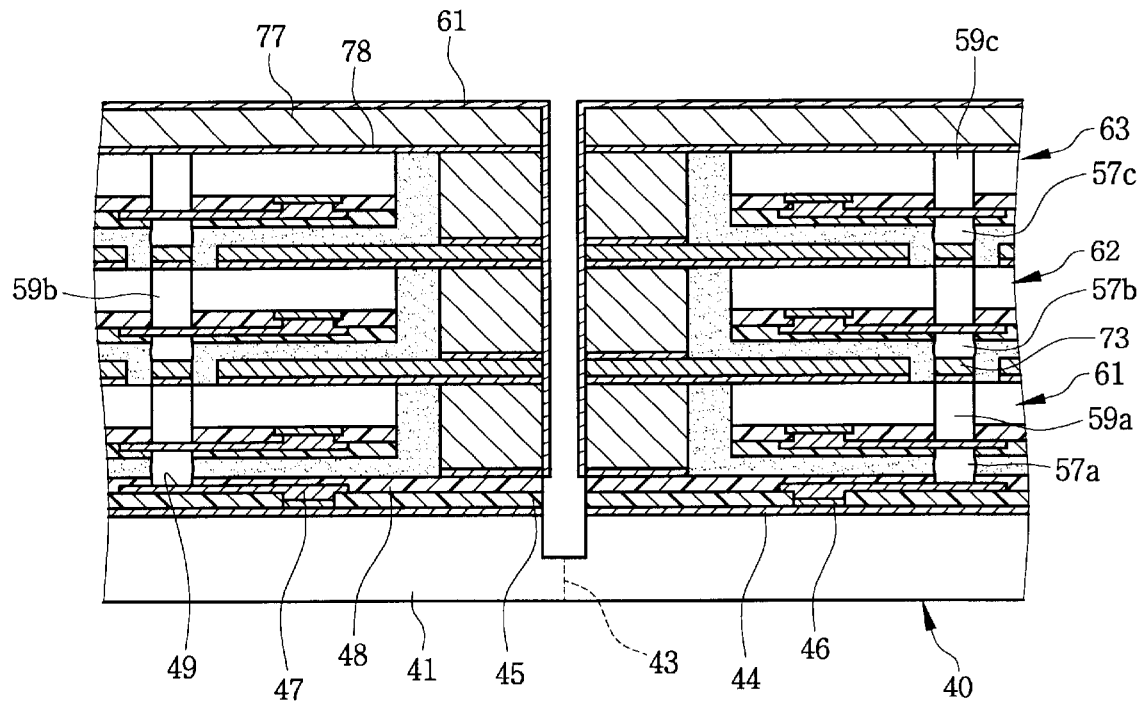

As shown in FIG. 25, the substrate 41 of the redistribution substrate 40 is cut along the scribing area 43 with a predetermined depth. This is a second cutting step.

Figure 26:
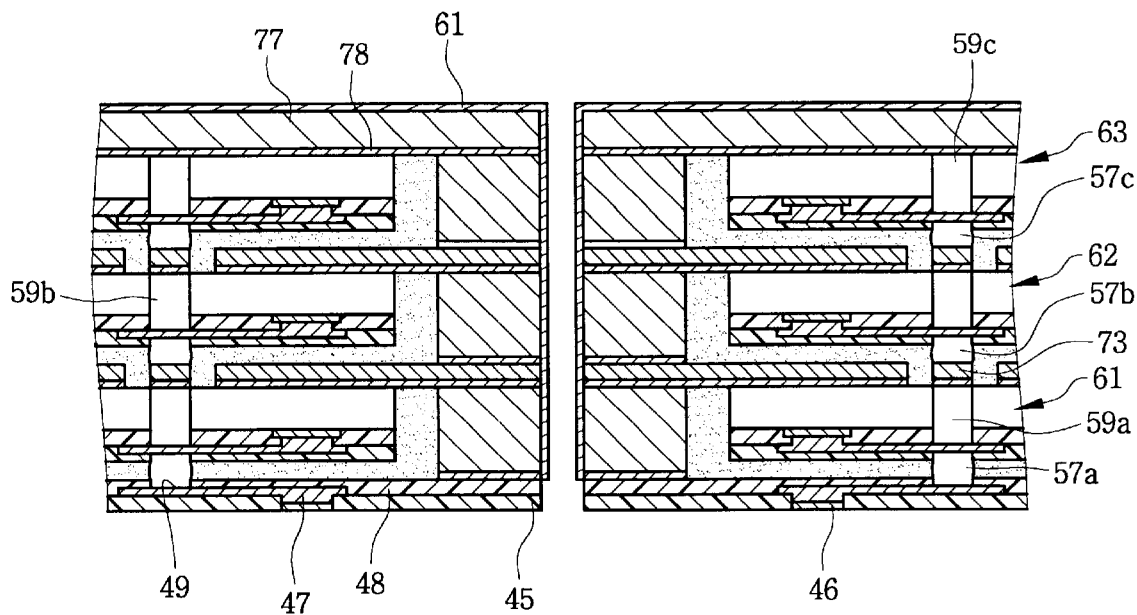

As shown in FIG. 26, the UBM layer (44 in FIG. 25) and the substrate 41 under the first dielectric layer 45 are removed by the wet-etching method, thereby obtaining individual stack packages. The redistribution layer 47 of the redistribution substrate 40 is protected by the first dielectric layer 45 and the Au-immersion layer 46.

The metal walls, the emissive metal layers and the lid metal layer form a metal barrier.

An object of the first cutting step is to form the Au-immersion layer 61 so as to prevent the cutting surfaces and the upper surface of the lid metal layer 77 from damage by an etching solution in a subsequent wet-etching step.

Figure 27:
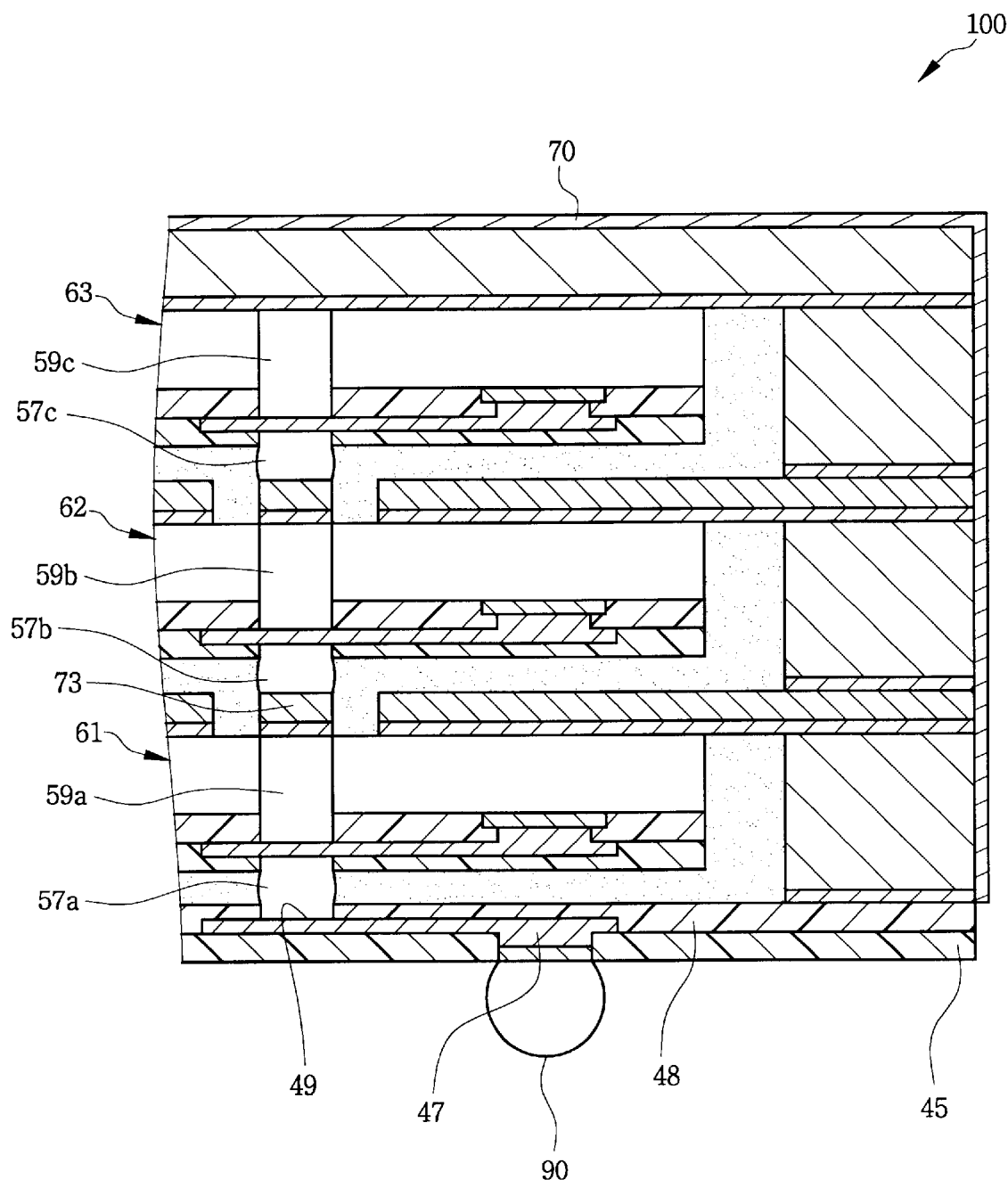

As shown in FIG. 27, an external connection terminal 90 such as a solder ball is formed on the Au-immersion layer 46 of the exposed redistribution layer 47, thereby obtaining a stack chip package 100. The external connection terminals 90 are the same as the inner connection terminals of the semiconductor chips in material and forming method.

In accordance with the first embodiment of the present invention, the wafer level semiconductor chips 61, 62, 63 to be three-dimensionally stacked are electrically connected to each other by the through holes filled with the conductive filled holes 59a, 59b, 59c, thereby achieving the stack chip package 100.

Further, the stack chip package 100 of the first embodiment of the present invention uses the semiconductor chips 61, 62, 63, which are tested and detected as good products, thereby preventing the failures of the stack chip packages due to using defective chips.

The filling layer is formed between the first semiconductor chip 61 and the redistribution substrate 40, the first semiconductor chip 61 and the second semiconductor chip 62, and the second semiconductor chip 62 and the third semiconductor chip 63. Therefore, the filling layer is added to the polymeric layer and improves the electrical properties. Further, the emissive metal layers interposed among the first, second and third semiconductor chips 61, 62, 63 effectively emit heat generated from the stack chip package 100 and improve the electrical properties. Moreover, since the emissive metal layer may be used as a ground, the present invention greatly improves the electrical properties of the stack chip package 100.

Although the first embodiment of the present invention has a stack chip package of a fan-in type, a stack chip package of a fan-out type may be achieved. A second embodiment of the present invention has a stack chip package which is a fan-out type, as described below.

FIGS. 28 to 35 illustrate a manufacturing method of a wafer level stack chip package in accordance with a second embodiment of the present invention.

The manufacturing of a redistribution substrate and of manufacturing a redistribution semiconductor chip of the second embodiment are the same as in the above-described first embodiment, and their detailed descriptions are omitted.

Figure 28:
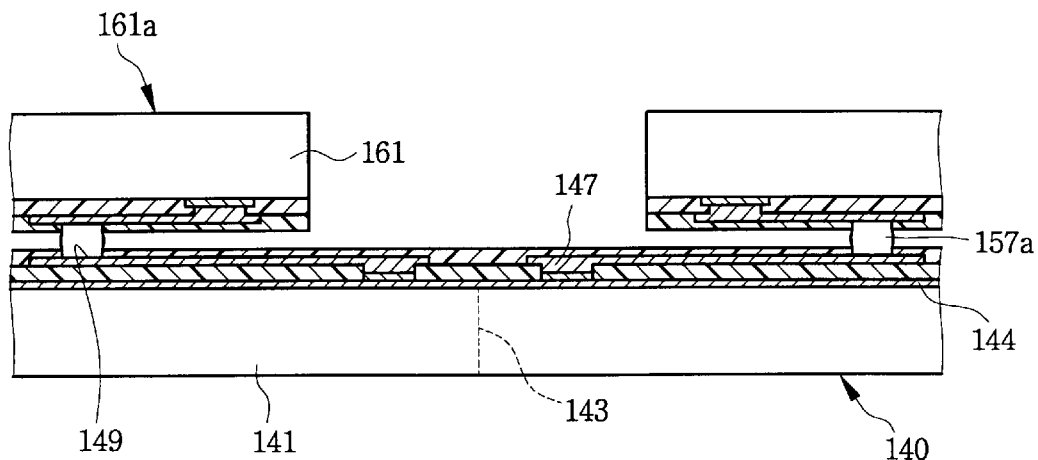
FIGS. 28 to 35 illustrate a manufacturing method of a wafer level stack chip package in accordance with a second embodiments of the present invention.

As shown in FIG. 28, a first semiconductor chip 161 is mounted on a redistribution substrate 140. First inner connection terminals 157a of the first semiconductor chip 160a are flip-chip bonded to substrate pads 149 of the redistribution substrate 140, thereby mounting the first semiconductor chip 161 on the redistribution substrate 140. In order to achieve the fan-out, a redistribution layer 147 extends to the scribing area 143 of the redistribution substrate 140.

Figure 29:
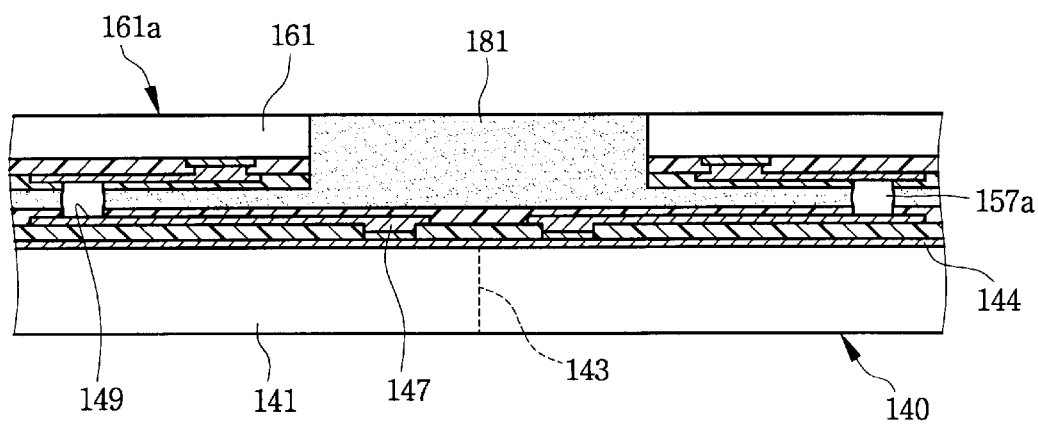

As shown in FIG. 29, an underfilling step is carried out. The flip chip bonding area between the redistribution substrate 140 and the first semiconductor chip 161 are filled with a liquid molding resin by an underfilling method, thereby forming a first filling layer 181. The first filling layer 181 protects the flip chip bonding area from the external environment.

Then, the back surface 161a of the first semiconductor chip 161 and the first filling layer 181 are ground, thereby minimizing the thickness of the package. After the back-grinding process, the first semiconductor chip 161 has a thickness of about 20 μm to 150 μm.

Figure 30:
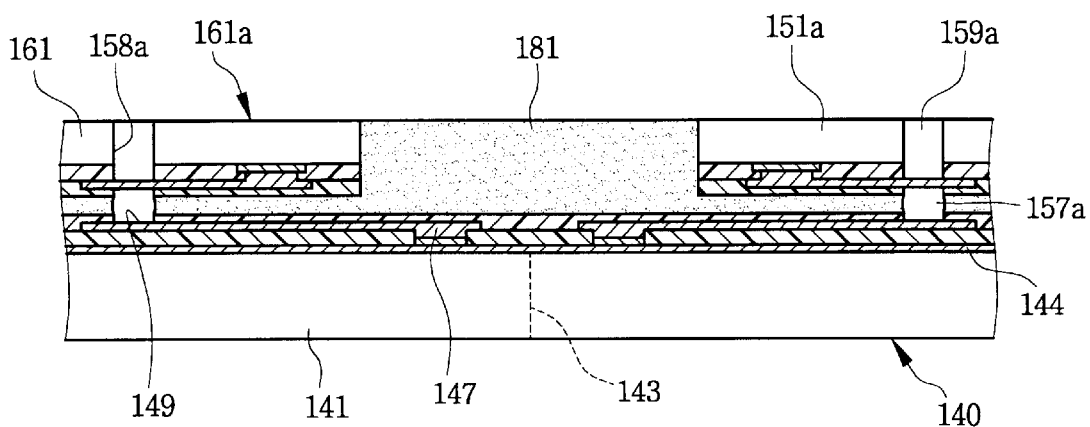

As shown in FIG. 30, through holes 158a are formed on the first semiconductor chip 161. The through holes 158 correspond to first inner connection terminals 157a and are formed by partially removing the first semiconductor substrate 151a and the passivation layer 153a with a dry or wet etching method. The inner diameter of the through hole 158a is about 10 μm to 100 μm. The through holes 158a are filled with a first conductive filling material 159a by an electroplating method using copper (Cu) or nickel (Ni).

Figure 31:
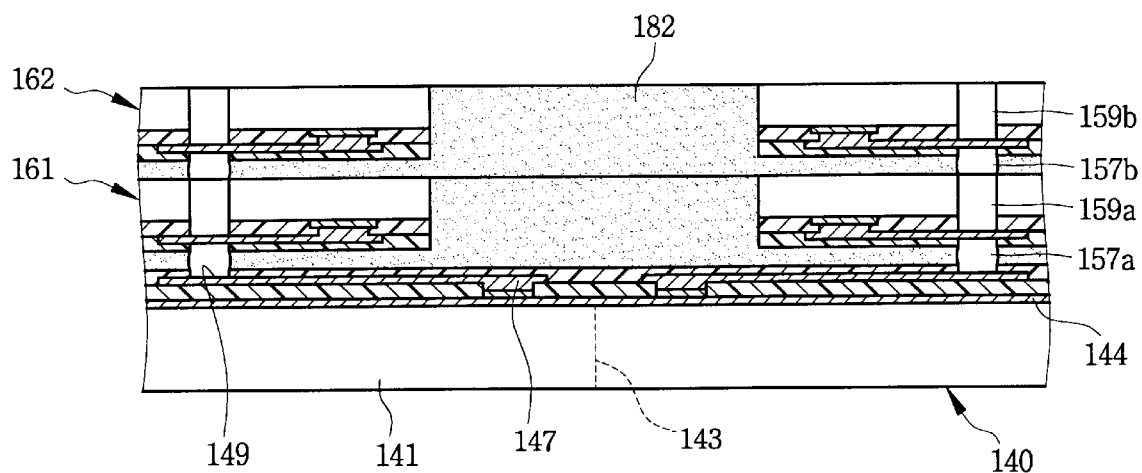

As shown in FIG. 31, a second semiconductor chip 162 is mounted. The second semiconductor chip 162 is mounted in the same manner as the first semiconductor chip 161. Second inner connection terminals 157b of the second semiconductor chip 162 are flip-chip bonded to the first filling material 159a.

Figure 32:
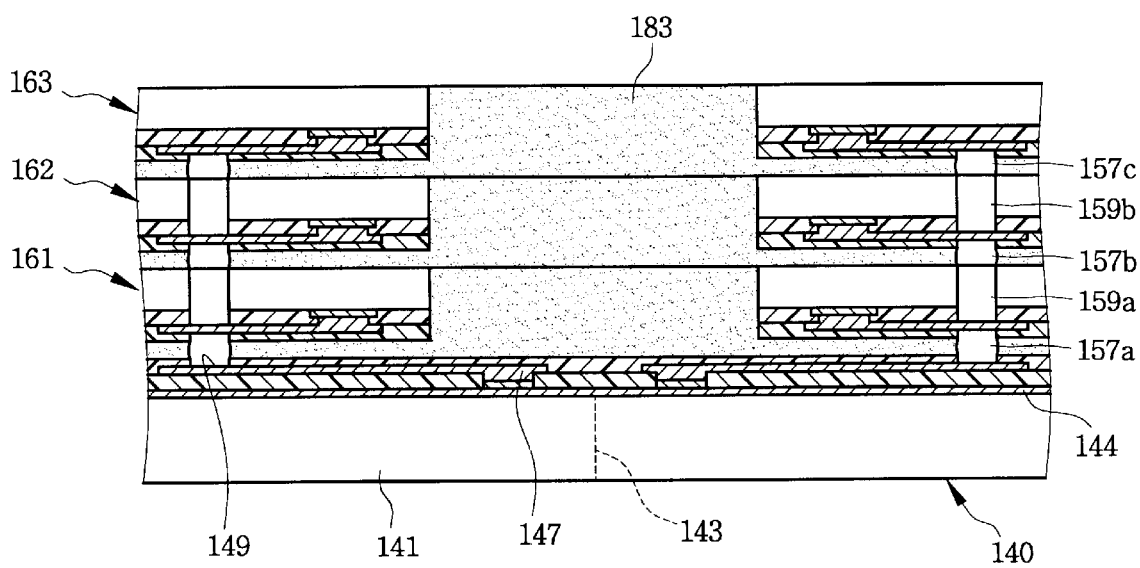

As shown in FIG. 32, a third semiconductor chip 163 is mounted. The third semiconductor chip 163 is mounted in the same manner as the first and second semiconductor chips 161, 162. Third inner connection terminals 157c of the third semiconductor chip 163 are flip-chip bonded to the second filling material 159b. Then, a third filling layer 183 is formed, and the back surface of the third semiconductor chip 163 and the third filling layer 183 are ground.

In order to separate the above-described stack chip package on the redistribution substrate into individual stack packages, a cutting step is carried out, as described below.

Figure 33:
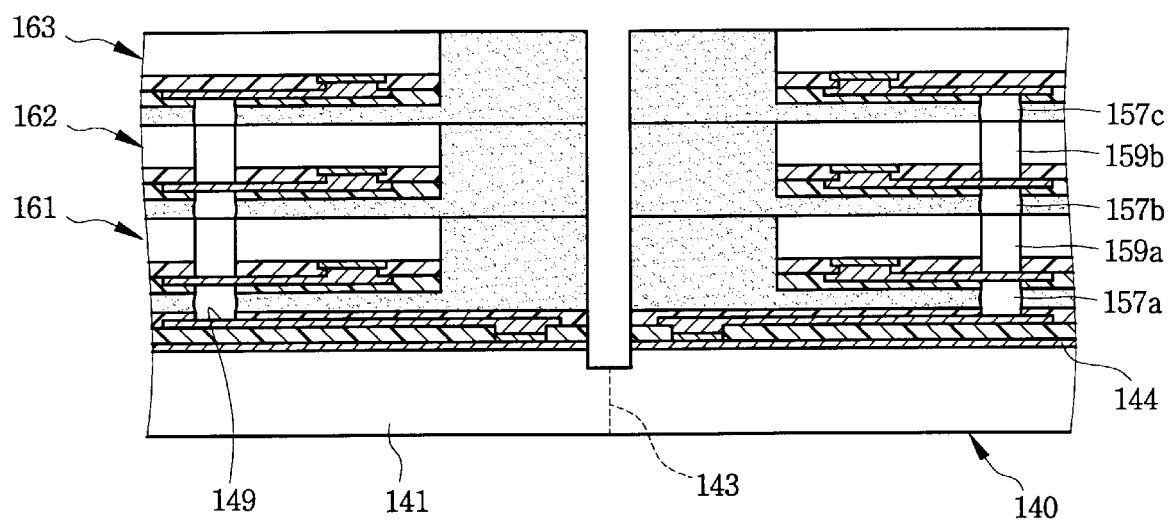

As shown in FIG. 33, the wafer level stack chip package on the redistribution substrate 140 is cut along the scribing area 143 up to the substrate 141. Although the first embodiment of the present invention comprises two cutting steps, the wafer level stack chip package of the second embodiment can be cut into a plurality of individual stack packages only by one step.

Figure 34:
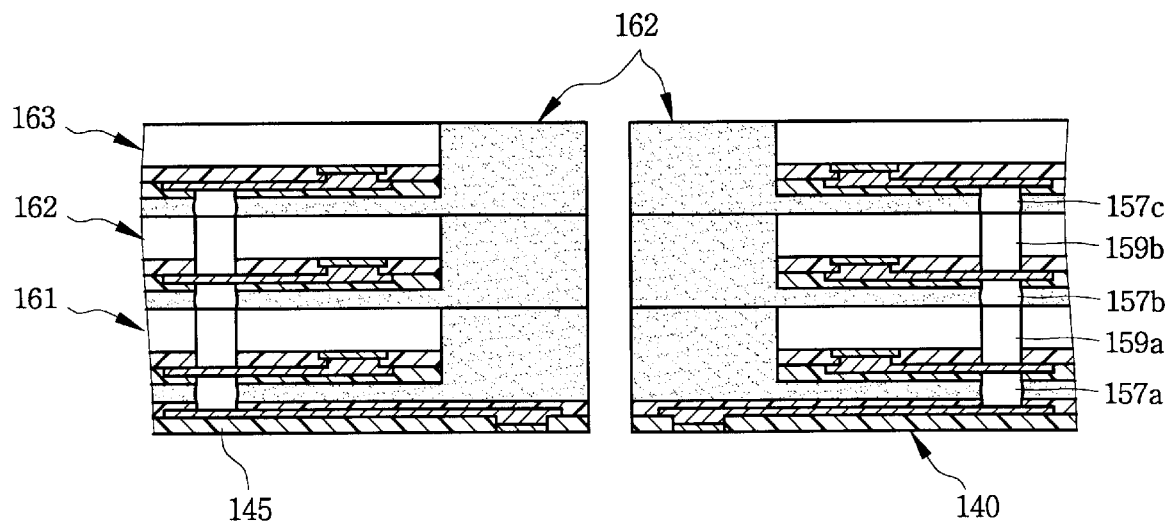

As shown in FIG. 34, the UBM layer (144 in FIG. 33) and the substrate 141 are removed by the wet-etching method, thereby obtaining individual stack packages.

Figure 35:
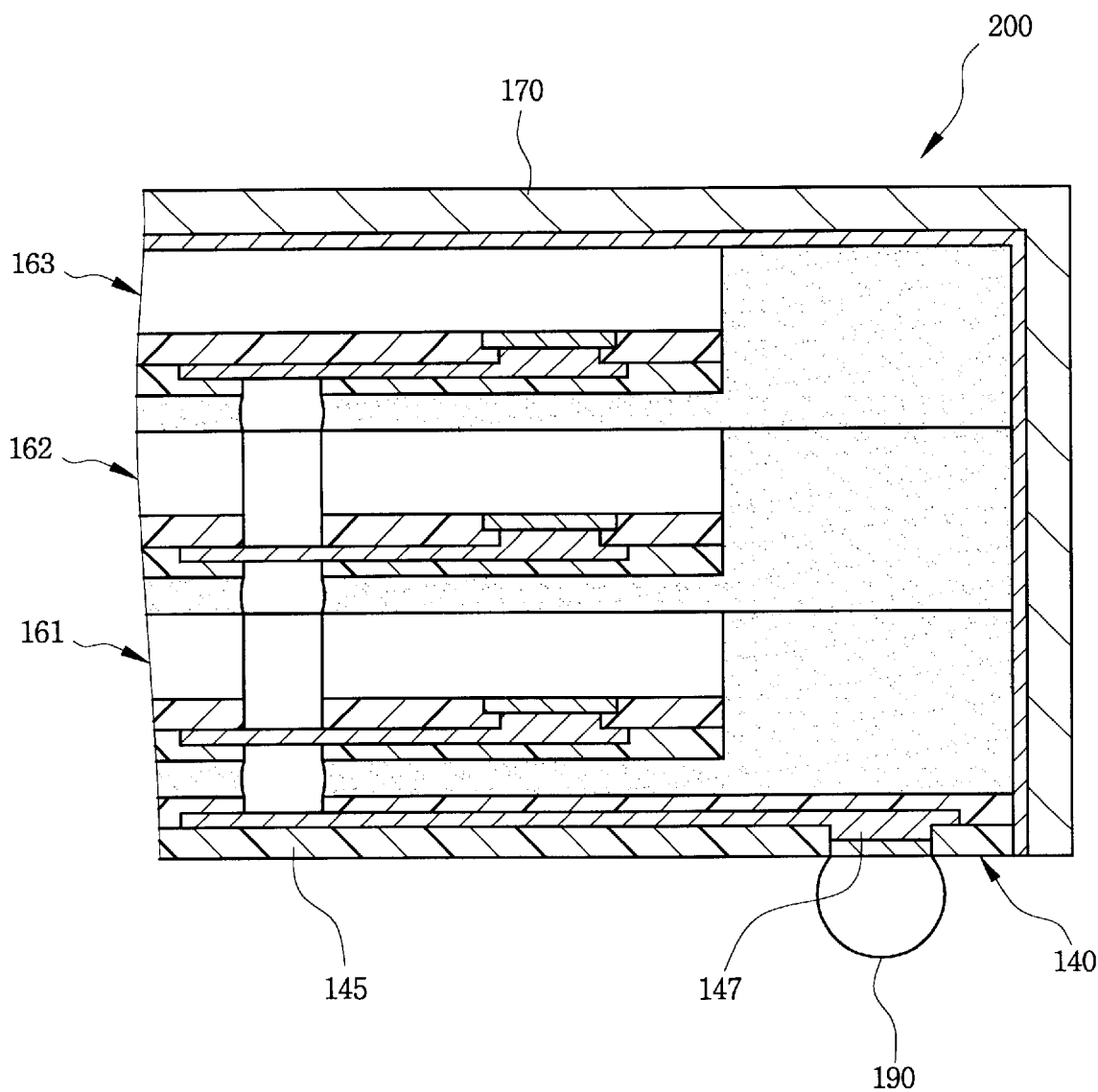

Then, as shown in FIG. 35, a metal lid 170 is formed on the whole surface of the stack package 164 except for the lower surface of the redistribution substrate 140. An external connection terminal 190 such as a solder ball is formed on the Au-immersion layer 146 of the exposed redistribution layer 147, thereby obtaining a stack chip package 200.

The second embodiment of the present invention is different from the first embodiment in that metal walls are not formed, nor are the separated individual stack package 200 coated by the metal lid. That is, the second embodiment of the present invention employs a redistribution substrate in a fan-out type, thereby achieving a stack chip package in a fan-out type.

In accordance with the preferred embodiments of the present invention, a plurality of wafer level semiconductor chips to be three-dimensionally stacked are electrically connected to each other by the conductive filling materials, thereby achieving a stack chip package using wafer level chip scale packages (WLCSPs).

Further, the stack chip package of the present invention may use the semiconductor chip which are tested and detected as good products, thereby preventing the failures of the stack chip packages due to the use of defective chips, improving the yield.

The filling layer is formed between the first semiconductor chip and the redistribution substrate, the first semiconductor chip and the second semiconductor chip, and the second semiconductor chip and the third semiconductor chip. Therefore, the filling layer is added to the polymeric layer and helps to prevent the deterioration of electrical properties which may occur due to the conventional thin polymeric layer. Further, the emissive metal layer that may be interposed between the semiconductor chips effectively emits the heat generated from the stack chip package and improves the electrical properties. Moreover, since the emissive metal layer may be used as a ground, the present invention greatly improves the electrical properties of the stack chip package.

The present invention achieves a wafer level stack chip package of a fan-in type as well as a wafer level stack chip package of a fan-out type.

Although the preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A method for manufacturing a wafer level stack chip package, said method comprising steps of:

(a) preparing a first semiconductor chip and a second semiconductor chip, each chip comprising:
a semiconductor substrate;
a passivation layer formed on the upper surface of said substrate;
a plurality of chip pads exposed from said passivation layer; and
a redistribution layer in a predetermined pattern formed on said passivation layer and electrically connected to said chip pads;

(b) preparing a redistribution substrate comprising:
a semiconductor substrate having chip mounting area for three-dimensionally stacking said first and second semiconductor chips and scribing area for separating said chip mounting area from other chip mounting area;
a first dielectric layer in a predetermined pattern;
a redistribution layer in a predetermined pattern formed on said first dielectric layer;
a second dielectric layer formed on said first dielectric layer and said redistribution layer; and
substrate pads exposed from said second dielectric layer and connected to said redistribution layer;

(c) forming a first metal wall in a predetermined depth along said scribing area of the redistribution substrate;

(d) flip-chip bonding the first inner connection terminals of said first semiconductor chip to said substrate pads of the redistribution substrate;

(e) filling said flip-chip bonding area between said first semiconductor chip and said redistribution substrate with a liquid molding resin, thereby forming a first filling layer;

(f) grinding the back surface of said first semiconductor chip and said first filling layer so as to expose the upper surface of said first metal wall;

(g) forming through holes on said redistribution layer of the first semiconductor chip and filling said through holes with a conductive filling material;

(h) forming a second metal wall correspondingly to said first metal wall;

(i) flip-chip bonding the second inner connection terminals of said second semiconductor chip to said through holes filled with the conductive filling material;

(j) filling said flip-chip bonding area between said first and second semiconductor chips with a liquid molding resin, thereby forming a second filling layer;

(k) grinding the back surface of said second semiconductor chip and said second filling layer so as to expose the upper surface of said second metal wall;

(l) cutting along said scribing area from said second metal wall to said semiconductor substrate of the redistribution substrate by a predetermined depth;

(m) separating into individual stack packages by etching said semiconductor substrate of the redistribution substrate; and (n) forming external connection terminals on exposed redistribution layer of said substrate pads.

2. The manufacturing method of the wafer level stack chip package claimed in claim 1, wherein step (a) comprises sub-steps of:

(a1) preparing a wafer having a semiconductor substrate, a passivation layer formed on said substrate and a plurality of chip pads exposed from said passivation layer;

(a2) forming a redistribution layer in a predetermined pattern on said passivation layer, said redistribution layer electrically connected to said chip pads;

(a3) forming a polymeric layer on said passivation layer and said redistribution layer; and (a4) forming inner connection terminals on exposed passivation layer from said polymeric layer.

3. The manufacturing method of the wafer level stack chip package claimed in claim 1, wherein step (b) comprises sub-steps of:

(b1) preparing a silicon substrate having chip mounting areas and scribing areas for separating said chip mounting area from other chip mounting area;

(b2) forming a first dielectric layer in a predetermined pattern on said silicon substrate;

(b3) forming a redistribution layer in a predetermined pattern on said first dielectric layer, said redistribution layer electrically connected to said silicon substrate via said first dielectric pattern;

(b4) forming a second dielectric layer on said first dielectric layer and said redistribution layer; and (b5) forming substrate pads for partially exposing said redistribution layer from said second dielectric layer.

4. The manufacturing method of the wafer level stack chip package claimed in claim 1, wherein step (c) comprises sub-steps of:

(c1) forming an under barrier metal (UBM) layer on portions of said second dielectric layer outside the perimeter of said substrate pads; and (c2) forming a first metal wall in a predetermined depth on said UBM layer.

5. The manufacturing method of the wafer level stack chip package claimed in claim 4, wherein step (c2) is a step of plating copper (Cu) or nickel (Ni with a thickness of about 20 $\mu$m to 150 $\mu$m).

6. The manufacturing method of the wafer level stack chip package claimed in claim 4, wherein step (h) comprises sub-steps of:

(h1) forming an emissive metal layer on said first semiconductor chip, said first filling layer and said first metal so as to electrically insulate said conductive filling material from other elements; and (h2) forming a second metal wall on said emissive metal layer correspondingly to said first metal wall.

7. The manufacturing method of the wafer level stack chip package claimed in claim 6, wherein step (i) is a step of flip-chip bonding the second inner connection terminals of said second semiconductor chip to said emissive metal layer on said through holes filled with the conductive filling material.

8. The manufacturing method of the wafer level stack chip package claimed in claim 1, wherein step (l) comprises sub-steps of:

(l1) first-cutting along said scribing area from said second metal wall to said semiconductor substrate of the redistribution substrate by a predetermined depth;

(l2) forming an Au-immersion layer on said lid metal layer and exposed metal layer from said cutting surface; and (l3) second-cutting the redistribution substrate by a predetermined depth along the first-cutting surface.

9. A method for manufacturing a wafer level stack chip package, said method comprising steps of:

(a) preparing a first semiconductor chip and a second semiconductor chip, each chip comprising:
a semiconductor substrate;
a passivation layer formed on the upper surface of said substrate;
a plurality of chip pads exposed from said passivation layer; and
a redistribution layer in a predetermined pattern formed on said passivation layer and electrically connected to said chip pads;

(b) preparing a redistribution substrate comprising:
a semiconductor substrate having a chip mounting area for three-dimensionally stacking said first and second semiconductor chips and scribing area for separating said chip mounting area from other chip mounting areas;
a first dielectric layer in a predetermined pattern;
a redistribution layer in a predetermined pattern formed on said first dielectric layer;
a second dielectric layer formed on said first dielectric layer and said redistribution layer; and
substrate pads exposed from said second dielectric layer and connected to said redistribution layer;

(c) flip-chip bonding the first inner connection terminals of said first semiconductor chip to said substrate pads of the redistribution substrate;

(d) filling said flip-chip bonding area between said first semiconductor chip and said redistribution substrate with a liquid molding resin, thereby forming a first filling layer;

(e) grinding the back surface of said first semiconductor chip and said first filling layer so as to expose the upper surface of said first metal wall;

(f) forming through holes on said redistribution layer of the first semiconductor chip and filling said through holes with a conductive filling material;

(g) flip-chip bonding the second inner connection terminals of said second semiconductor chip to said through holes filled with the conductive filling material;

(h) filling said flip-chip bonding area between said first and second semiconductor chips with a liquid molding resin, thereby forming a second filling layer;

(i) grinding the back surface of said second semiconductor chip and said second filling layer so as to expose the upper surface of said second metal wall;

(j) cutting along said scribing area from said second metal wall to said semiconductor substrate of the redistribution substrate by a predetermined depth;

(k) separating into individual stack packages by etching said semiconductor substrate of the redistribution substrate;

(l) forming a metal lid coating the outer surfaces of said stack package except for said first dielectric layer of the redistribution substrate; and (m) forming external connection terminals on exposed redistribution layer of said substrate pads.

10. A wafer level stack chip package formed by three-dimensionally stacking a plurality of semiconductor chip, said stack chip package comprising:

(A) a redistribution substrate comprising:
a first dielectric layer in a predetermined pattern;
a redistribution layer in a predetermined pattern formed on said first dielectric layer;
a second dielectric layer formed on said first dielectric layer and said redistribution layer; and
substrate pads exposed from said second dielectric layer and connected to said redistribution layer;

(B) at least one lower semiconductor chip to be three-dimensionally stacked on said redistribution substrate, said lower semiconductor chip comprising:
a semiconductor substrate;
a passivation layer formed on the upper surface of said substrate;
a plurality of chip pads exposed from said passivation layer;
a redistribution layer in a predetermined pattern formed on said passivation layer and electrically connected to said chip pads;
a polymeric layer formed on said passivation and said redistribution layer, and having through holes for partially exposing said redistribution layer, said through holes corresponding to said substrate pads;
inner connection terminals formed on and electrically connected to the exposed redistribution layer through said through holes; and
a conductive filling material for filling said through holes;

(C) an uppermost semiconductor chip comprising:
a semiconductor substrate;
a passivation layer formed on the upper surface of said substrate;
a plurality of chip pads exposed from said passivation layer;
a redistribution layer in a predetermined pattern formed on said passivation layer and electrically connected to said chip pads;
a polymeric layer formed on said passivation and said redistribution layer, and having through holes for partially exposing said redistribution layer, said through holes corresponding to said substrate pads; and
inner connection terminals formed on and electrically connected to the exposed redistribution layer through said through holes;

(D) a filling layer for filling areas between two chips among said lower semiconductor chips and said uppermost semiconductor chip to be stacked on said redistribution substrate, thereby protecting said inner connection terminals;

(E) a metal lid for coating the surfaces of said lower semiconductor chips, said uppermost semiconductor chip and said redistribution substrate except for said first dielectric layer of the redistribution substrate; and (F) external connection terminals formed on and electrically connected to the exposed redistribution layer from said first dielectric layer of the redistribution substrate, wherein said inner connection terminals of the uppermost semiconductor chip are flip-chip bonded to said through holes filled with the conductive filling material of the lower semiconductor chip.

11. The wafer level stack ship package in claim 10, wherein said filling layer comprises:

a first filling layer for filling an area between said redistribution substrate and said lower semiconductor chip, thereby protecting said inner connection terminals flip-chip bonded to said redistribution substrate;

a second filling layer for filling an area between said lower semiconductor chips, thereby protecting said inner connection terminals of said lower semiconductor chip; and a third filling layer for filling an area between said lower semiconductor chip and said uppermost semiconductor chip, thereby protecting said inner connection terminals of said uppermost semiconductor chip.

12. The wafer level stack chip package of claim 11, further comprising an emissive metal layer formed on said lower semiconductor chip and said filling layer so as to electrically insulate said conductive filling material from other elements, wherein said emissive metal layer is connected to said metal lid.

13. The wafer level stack chip package of claim 12, wherein said inner connection terminals of said lower and uppermost semiconductor chips are flip-chip bonded to said emissive metal layer over said conductive filling material.

14. The wafer level stack chip package of claim 13, wherein said emissive metal layer is a plating layer made of titanium (Ti) or chromium (Cr) with a thickness of several thousands Å and less, and copper (Cu) or nickel (Ni) with a thickness of several thousands Å to several $\mu$m.

15. The wafer level stack chip package of claim 14, wherein said metal lid comprises:

a first metal wall formed on said redistribution substrate outside the perimeter of said lower semiconductor chip;

a second metal wall formed on said emissive metal layer correspondingly to said first metal wall; and a lid metal layer formed on said second metal wall and said uppermost semiconductor chip.

16. The wafer level stack chip package of claim 15, wherein said first and second metal walls are plating layers made of copper (Cu) or nickel (Ni) with a thickness of about 20 $\mu$m to 150 $\mu$m.

* * * * *